(12) United States Patent
Guerreri et al.

(10) Patent No.: US 8,977,215 B2
(45) Date of Patent: Mar. 10, 2015

(54) FREQUENCY TRANSLATION DEVICE AND WIRELESS COMMUNICATION SYSTEM USING THE SAME

(75) Inventors: Carl N. Guerreri, Manassas, VA (US); Brady H. Warner, Jr., Leesburg, VA (US); Paul J. Schick, Medford Lakes, NJ (US); Oscar A. Fahrenfeld, Lawrenceville, NJ (US)

(73) Assignee: Electronic Warfare Associates, Inc., Herndon, VA (US)

( * ) Notice: Subject to any disclaimer, the term of this patent is extended or adjusted under 35 U.S.C. 154(b) by 299 days.

(21) Appl. No.: 12/369,411

(22) Filed: Feb. 11, 2009

(65) Prior Publication Data

US 2009/0227203 A1 Sep. 10, 2009

Related U.S. Application Data

(60) Provisional application No. 61/034,738, filed on Mar. 7, 2008.

(51) Int. Cl.
*H04B 1/40* (2006.01)

(52) U.S. Cl.
USPC .............................................. 455/76; 455/118

(58) Field of Classification Search
USPC .................... 455/73, 75, 76, 78, 113, 118
See application file for complete search history.

(56) References Cited

U.S. PATENT DOCUMENTS

| | | | | |
|---|---|---|---|---|
| 4,864,257 | A * | 9/1989 | Vandegraaf | 332/125 |
| 5,892,407 | A * | 4/1999 | Ishii | 331/17 |
| 6,028,850 | A * | 2/2000 | Kang | 370/320 |
| 6,681,100 | B1 * | 1/2004 | Ge | 455/78 |
| 6,864,753 | B2 * | 3/2005 | Lee et al. | 331/17 |
| 7,248,841 | B2 * | 7/2007 | Agee et al. | 455/101 |
| 7,664,475 | B2 * | 2/2010 | Ichihara | 455/168.1 |
| 8,280,337 | B2 * | 10/2012 | Dubois et al. | 455/307 |
| 2002/0025778 | A1 * | 2/2002 | Lee | 455/3.05 |
| 2002/0103012 | A1 * | 8/2002 | Kim et al. | 455/562 |
| 2006/0019604 | A1 * | 1/2006 | Hasarchi | 455/15 |
| 2007/0099582 | A1 * | 5/2007 | Chen et al. | 455/76 |
| 2007/0149143 | A1 * | 6/2007 | Kim et al. | 455/76 |
| 2007/0224932 | A1 * | 9/2007 | Wong et al. | 455/13.4 |
| 2007/0291668 | A1 * | 12/2007 | Duan | 370/280 |

* cited by examiner

*Primary Examiner* — Quan Tra

(74) *Attorney, Agent, or Firm* — DLA Piper US LLP

(57) ABSTRACT

A frequency translation device includes a transmit circuit including a first frequency converter configured to convert a signal at a first frequency into a signal at a second frequency. A receive circuit includes a second frequency converter configured to convert a signal at the second frequency into a signal at the first frequency. A detector circuit is configured to determine when the frequency translation device is receiving a signal, and to route the signal to the transmit circuit or to the receive circuit.

24 Claims, 3 Drawing Sheets

FREQUENCY TRANSLATION DEVICE AND WIRELESS COMMUNICATION SYSTEM USING THE SAME

CROSS-REFERENCE TO RELATED APPLICATIONS

This application is based on and derives the benefit of U.S. Provisional Patent Application No. 61/034,738, filed on Mar. 7, 2008, the contents of which are incorporated herein by reference in its entirety.

FIELD OF INVENTION

The present invention relates generally to wireless communications and more particularly to a frequency translation device for converting a signal at one frequency to a signal at another frequency.

DETAILED DESCRIPTION OF EMBODIMENTS OF THE INVENTION

Figure 1:
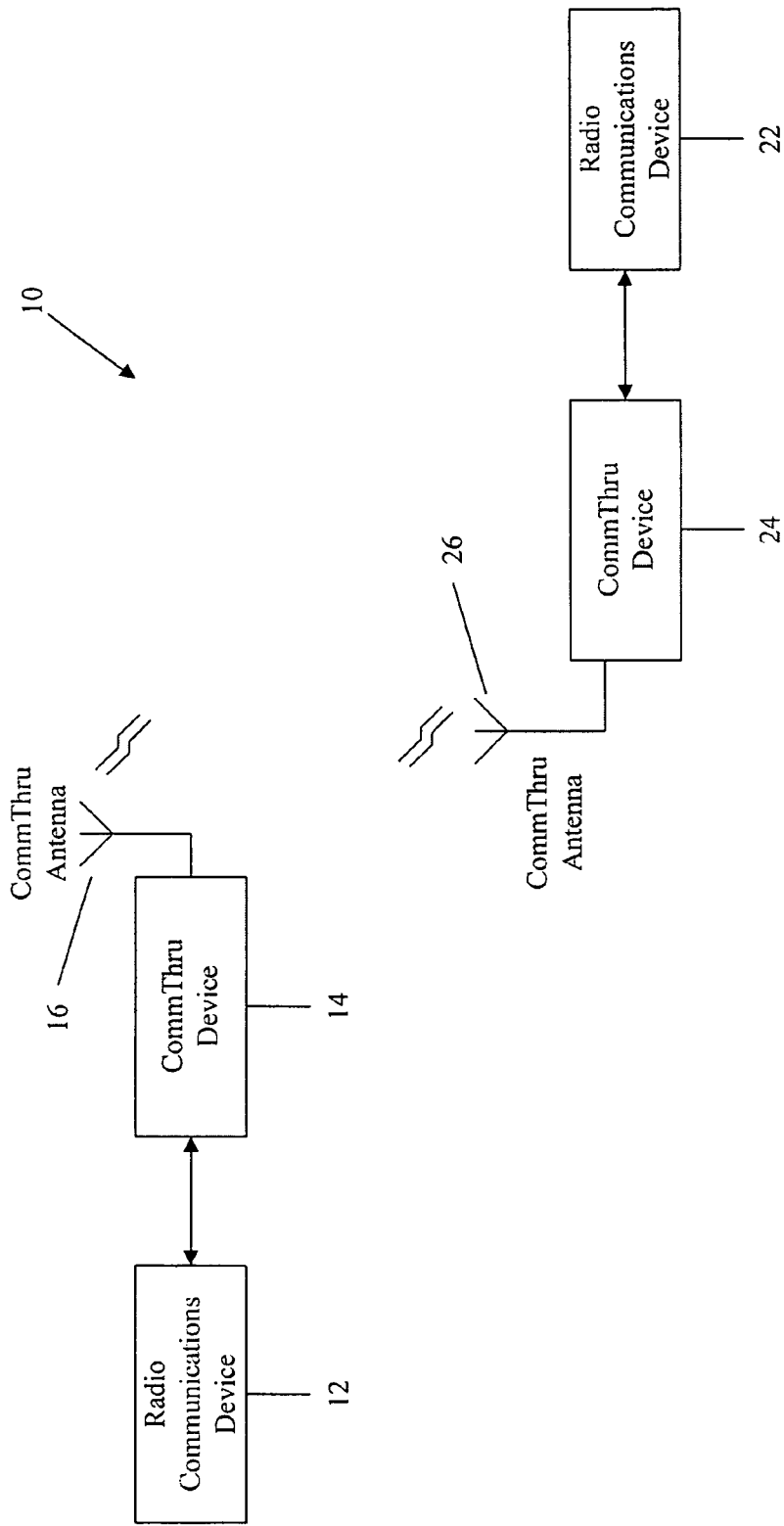
FIG. 1 depicts a functional block diagram of a wireless communication system, according to an embodiment of the present invention.

FIG. 1 depicts a functional block diagram of a wireless communication system, according to an embodiment of the present invention. In this embodiment, the wireless communication system 10 includes a first transceiver 12 such as, but not limited to, a radio communications device, a WiFi device or any other wireless communication device. The first transceiver can function as a transmitter, a receiver or both. In one embodiment, the first transceiver may be any currently fielded radio. The system 10 also includes a frequency translating or converting device (referred to herein as CommThru device) 14 and a first antenna 16. The frequency translating device 14 is in communication with the first transceiver and the first antenna 16. The system 10 further includes a second transceiver 22 such as a radio transceiver, a WiFi transceiver, or any other communication device. Similar to the first transceiver 12, the second transceiver 22 can function as a transmitter, a receiver or both. In one embodiment, the first transceiver may be any currently fielded radio. The system 10 also includes a frequency translating or converting device (referred to herein as CommThru device) 24 and a second antenna 26. The frequency translating device 24 is in communication with the second transceiver and the second antenna 26.

The frequency translation devices 14 and 24 are configured to convert a signal from one part of the frequency spectrum or band to another part of the frequency spectrum or band. In one embodiment, one frequency band can be, for example, between about 30 MHz and about 90 MHz. In one embodiment, the frequency translation can be implemented using a heterodyne approach using either a single or dual mixer approach, as will be described further in the following paragraphs. However, other approaches can also be implemented. The frequency translation devices 14 and 24 can enable communications between commonly used fielded radios in the presence or absence of nearby powerful jamming sources and other sources of interference in the frequency band used by the first and second transceivers 12 and 22. The frequency translation devices 14 and 24 can allow the transmission system 10 to utilize all of its potential capabilities (e.g., encryption, frequency hopping spread spectrum, various modulations, etc.) without restriction.

The frequency translating devices 14 and 24 can be adapted to work with any transceiver. For example, the input of the frequency translating devices 14 and 24 can be modified or adapted to work in the desired frequency range and bandwidth of the first and second transceivers 12 and 22.

The frequency translating devices 14 and 24 can be totally transparent to the user of the communication system 10. The user can operate the first transceiver 12 and second transceiver 22 normally and the frequency translation is handled by the respective frequency translation devices 14 and 24. Hence, no additional operator training may be needed once the frequency translation devices 14 and 24 are installed.

The bandwidth of the frequency translation devices 14 and 24 may be equal to the frequency bandwidth of the transceivers 12 and 24 to which they are coupled. The frequency bandwidth of the transceiver 12 can be, for example, centered around frequency $f_{11}$. The translation device 14 is adapted to convert frequency $f_{11}$ to $f_{12}$. The frequencies $f_{11}$ and $f_{12}$ are shifted relative to each other. Similarly, the frequency bandwidth of the transceiver 22 can be, for example, centered around frequency $f_{22}$. The frequency translation device 14 is adapted to convert frequency $f_{22}$ to $f_{21}$. The frequencies $f_{21}$ and $f_{22}$ are shifted relative to each other. The antennas 16 and 26 which are connected to the respective frequency translation devices 16 and 26 can be optimized to the translated frequency $f_{12}$ and $f_{21}$, respectively. To allow the antennas 16 and 26 to transmit and/or receive signals to and from each other, i.e., to communicate with each other, the frequencies $f_{12}$ and $f_{21}$ are set so as to be substantially the same. However, the frequency $f_{11}$ of the transceiver 12 can be the same as the frequency $f_{22}$ of the transceiver 22 or can be different.

In operation, for example, one user presses a push-to-talk button on transceiver (e.g., radio) 12 and begins to speak. The frequency translation device 14 detects that the transceiver (e.g., radio) 12 is transmitting and switches internal relays so that it enters into transmit mode. The frequency $f_{11}$ of the RF signal from the transceiver 12, which acts in this example as a transmitter, is up-converted to a higher frequency $f_{12}$ outside a jammer frequency band or outside an interference frequency band. The up-converted higher frequency signal is then transmitted through the antenna 16.

The antenna 26 which is coupled to frequency translating device 24 receives the frequency up-converted signal and the frequency up-converted signal is transmitted to the frequency translation device 24. The frequency translation device 24 detects that the antenna 26 is receiving a signal and switches internal relays so that it enters into a receiving mode. The frequency $f_{12}$ of the signal transmitted by antenna 16 is substantially the same as the frequency $f_{21}$ to which the antenna 26 is tuned. Hence, the frequency of the signal received by the antenna 26 is equal to the frequency $f_{12}$ of the transmitted signal. The frequency of the signal $f_{12}$ (which is substantially equal to frequency $f_{21}$) received by the antenna 26 is down-converted to a lower frequency $f_{22}$ to which the transceiver (e.g., radio) 22 is tuned. As a result, another user can hear the incoming signal. As stated above, the frequency $f_{11}$ on which the transceiver 12 is tuned and the frequency $f_{22}$ to which the transceiver 22 is tuned can be the same, i.e., $f_{11}=f_{22}$, or different.

Figure 2:
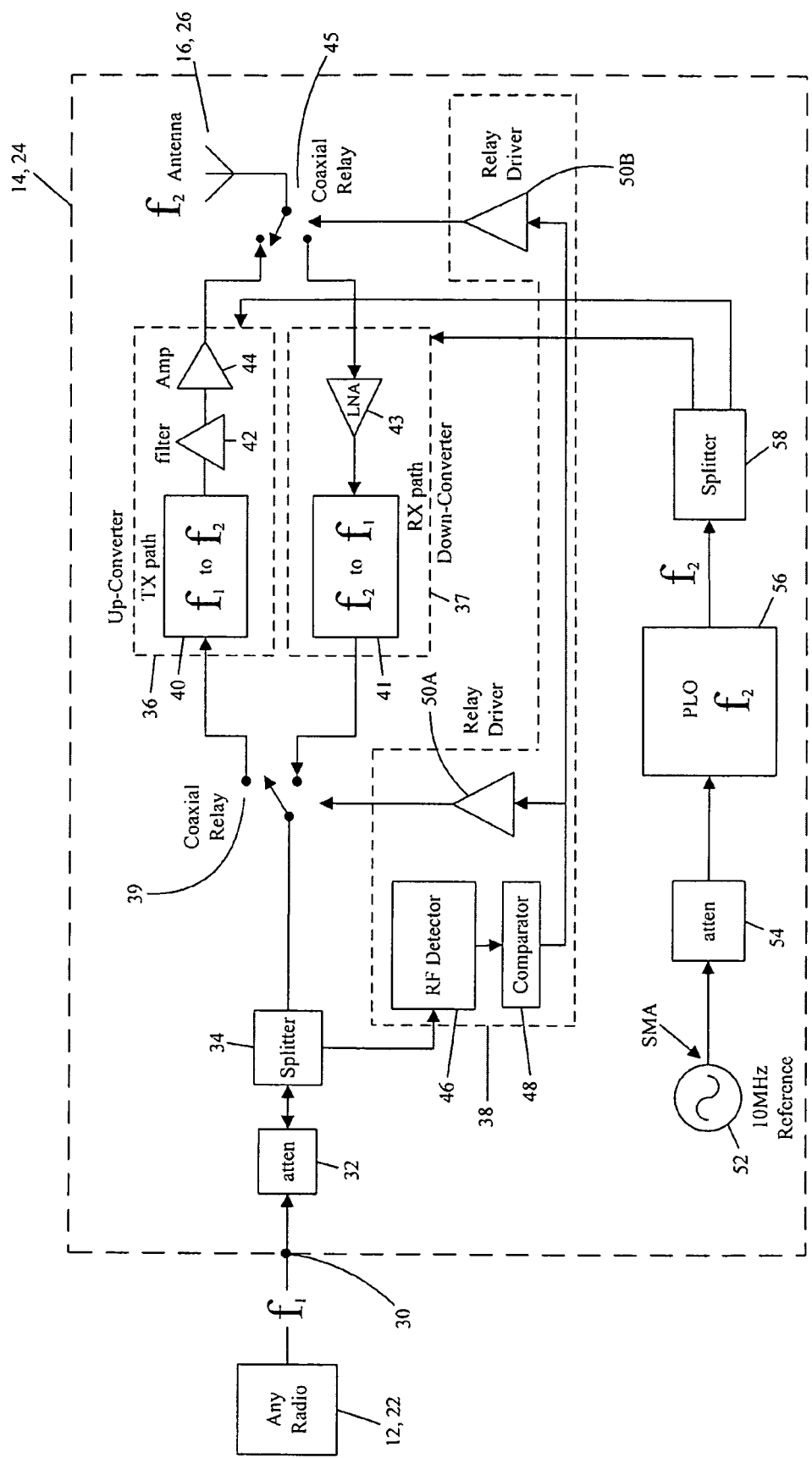
FIG. 2 depicts an internal block diagram of a frequency translation device, according to an embodiment of the present invention.

FIG. 2 depicts the internal block diagram of the frequency translation device 14, 24, according to an embodiment of the present invention. The frequency translation device 14, 24 includes an attenuator 32. The attenuator 32 is coupled to a port 30 of the frequency translation device 14, 24. The transceiver 12, 22 can be coupled to the frequency translation device 14, 24 via port 30. The attenuator 32 is configured to attenuate or drop the power level of a signal input through port 30 to a level suitable for the circuitry of the frequency translation device 14, 24. The frequency translation device 14, 24 further includes a splitter 34. The splitter 34 can be coupled to an output of the attenuator 32. The frequency translation device 14, 24 also includes a transmit circuit 36, a receive circuit 37 and a detector circuit 38. The splitter 34 is used to split the attenuated signal output by attenuator 32 between the detector circuit 38 and the transmit/receive circuits 36, 37. Although, the frequency translation device 14, 24 is depicted in FIG. 2 having both a transmit circuit 36 and a receive circuit 37, the frequency translation device 14, 24 may include a transmit circuit 36 only or a receive circuit 37 only or both a transmit circuit 36 and a receive circuit 37.

The transmit circuit 36 may include a frequency up-converter device 40 connected to splitter 34 via relay 39, a filter 42 connected to up-converter device 40, and amplification device 44 connected to the filter 42. The frequency up-converter device 40 is configured to up-convert a frequency $f_1$ of a signal received from the splitter 34 via relay 39 into a signal with frequency $f_2$. For example, with respect to frequency translation device 14, the frequency $f_1$ corresponds to the frequency $f_{11}$ and the frequency $f_2$ corresponds to the frequency $f_{12}$, as described in the above paragraphs with respect to FIG. 1. The transmit circuit 36 can be connected to antenna 16, 26 via relay 45. In this embodiment, the antenna 16, 26 is shown integrated within the frequency translation device 14, 24. However, as shown in FIG. 1, the antenna 16, 26 can be located outside the frequency translation device 14, 24. The up-converted signal with frequency $f_2$ can then be transmitted to filter 42 for filtering certain frequency components of the signal, for example, to remove undesired frequency components to obtain a filtered signal. The filtered signal can then be amplified using amplifier 44. The amplified signal is then sent to antenna 16, 26 via relay 45 to be transmitted using antenna 16, 26.

The receive circuit 37 may include a frequency down-converter device 41 connected to splitter 34 via relay 39 and a low noise amplifier (LNA) device 43. The frequency down-converter device 41 is configured to down-convert a frequency $f_2$ of a signal received from the antenna 16, 26 via relay 45 into a signal with frequency $f_1$. The LNA device 43 is connected to antenna 16, 26 via relay 45. The LNA device is configured to amplify a signal received from the antenna 16, 26 and to input the amplified signal into the down-converter device 41. The down-converter device 41 can down-convert the frequency of the amplified signal from frequency $f_1$ to frequency $f_2$ and can route the down-converted signal at frequency $f_2$ to splitter 34 via relay 39. The signal from the splitter 34 can then be output via port 30 and forwarded to the transceiver 12, 22 for further processing. For example, the signal can be transformed by the transceiver 12, 22 into sound or data, etc.

The detector circuit 38 may include radiofrequency (RF) detector 46, comparator 48 and relay drivers 50A and 50B. The RF detector 46 is connected to splitter 34. The comparator 48 is connected to RF detector 46 on one end. The comparator 48 is also connected to both relay drivers 50A and 50B, on the other end. Relay drivers 50A and 50B are coupled to relays 39 and 45 to control the relays 39 and 45, respectively. The RF detector circuit 38 is used to determine when the connected transceiver (e.g. radio) 12, 22 is transmitting and controls the relays 39 and 45 in the frequency translation device 14, 24 to enable a transmit operation when the RF detector circuit 38 senses a signal is received from the transceiver 12, 22.

In operation, when the RF detector 46 detects a signal is output by splitter 34, the RF detector 46 generates a signal and the signal is input into comparator 48 which outputs a signal to both relay drivers 50A and 50B. The relay driver 50A then causes the relay 39 to connect the splitter 34 to the transmit circuit 36. Also, relay driver 50B causes the relay 45 to connect the output of transmit circuit 36 to the antenna 16, 26. In this configuration, a signal output by the splitter 34 can be transmitted to transmit circuit 36 and a frequency up-converted signal output by the transmit circuit 36 can pass through the relay 45 to antenna 16, 26 to be transmitted to another frequency translation device 14, 24. When the RF detector 46 does not detect a signal from splitter 34, the RF detector 46 can indicate to the relay drivers 50A and 50B that the RF detector 46 did not detect a signal from splitter 34. As a result, the relay driver 50A causes the relay 39 to switch back and connect the splitter 34 to the receive circuit 37 and the relay 50B causes the relay 45 to switch back and connect the antenna 16, 26 to the receive circuit 37. In this configuration, a signal received by antenna 16, 26 can be routed to receive circuit 37 via relay 45 and a frequency down-converted signal output by receive circuit 41 can be routed via relay 39 to transceiver 12, 22 for further processing.

The frequency translation device 14, 24 can further include a frequency reference, such as a 10 MHz reference clock 52, an attenuator 54, a Phase Locked Oscillator (PLO) 56 and splitter 58. The output of the frequency reference 52 is connected to attenuator 54 which is in turn connected to PLO 56. The phase of the signal output by the PLO 56 is made to follow the phase of frequency reference 52. An output of the PLO 56 is connected to splitter 58. The splitter 58 is in turn coupled to the transmit circuit 36 and the receive circuit 37. The splitter 58 splits a signal output by the PLO 56 into two signals.

One signal can be used to set the up-conversion frequency in the frequency up-converter 40 and the other signal can be used to set the down-conversion frequency in the frequency down-converter 41. The frequency reference 52 and the PLO 56 cooperate to generate the conversion frequency $f_2$ for both the frequency up-converter 40 and the frequency down-converter 41.

Figure 3:
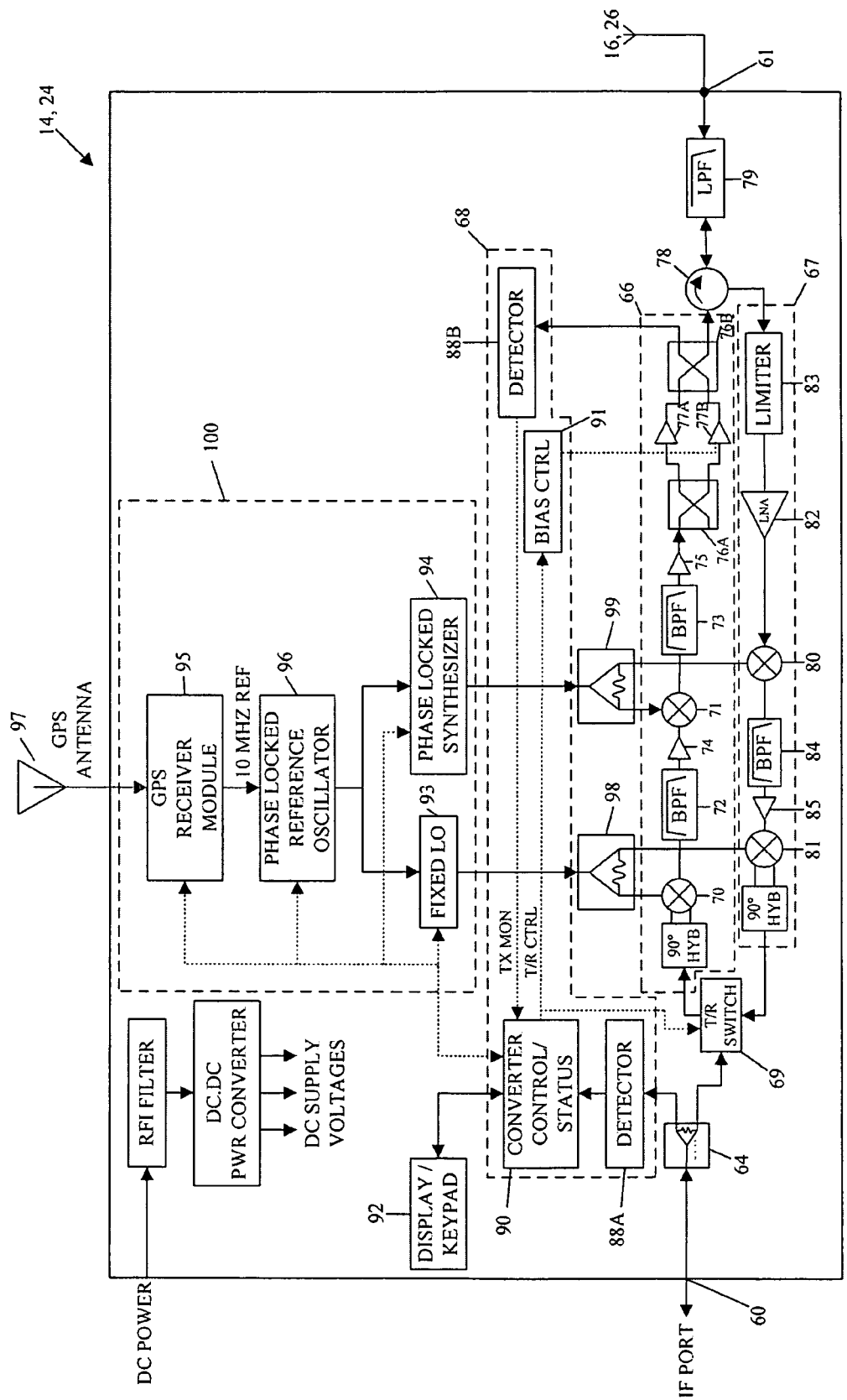
FIG. 3 depicts an internal block diagram of a frequency translation device, according to another embodiment of the present invention.

FIG. 3 depicts the internal block diagram of the frequency translation device 14, 24, according to another embodiment of the present invention. The frequency translation device 14, 24 may include a port 60. The transceiver 12, 22 can be coupled to the frequency translation device 14, 24 via port 60. The frequency translation device 14, 24 may also include a splitter 64 coupled to the port 60. The frequency translation device 14, 24 may also include an attenuator (not shown). The attenuator can be configured to attenuate or drop the power level of a signal input through port 60 to a level suitable for the circuitry of the frequency translation device 14, 24. Hence, in one embodiment, the splitter 64 can be connected to the port 60 via the attenuator (not shown). The frequency translation device 14, 24 may also include a transmit circuit 66, a receive circuit 67 and a detector circuit 68. The splitter 64 is used to split a signal from port 60 between the detector circuit 68 and the transmit/receive circuits 66, 67. Although, the frequency translation device 14, 24 is depicted in FIG. 3 having both a transmit circuit 66 and a receive circuit 67, the frequency translation device 14, 24 may include a transmit circuit 66 only or a receive circuit 67 only or both a transmit circuit 66 and a receive circuit 67.

The transmit circuit 66 may include a first frequency up-converter device 70 connected to splitter 64 via relay (e.g., transmit-receive switch) 69, a first filter 72 connected to the first frequency up-converter device 70, and a first amplification device 74 connected to the first filter (e.g., bandpass filter—BPF) 72. The transmit circuit 66 may further include a second frequency up-converter device 71 connected to the first amplification device 74, a second filter (e.g., bandpass filter—BPF) 73 connected to the second frequency up-converter device 71, and a second amplification device 75 connected to the second filter 73. The transmit circuit 66 may also include other components such as combiners 76A and 76B and amplifiers 77A and 77B.

The transmit circuit 66 may be connected to circulator 78 which, in turn, may be connected to third filter (e.g., low pass filter—LPF) 79. The third filter can be connected to antenna 16, 26 via port 61. In this embodiment, the antenna 16, 26 is shown located outside the frequency translation device 14, 24. However, as shown in FIG. 2, the antenna 16, 26 can be located inside the frequency translation device 14, 24.

The first frequency up-converter device 70 is configured to up-convert a frequency $f_1$ of a signal received from the splitter 64 via relay 69 into a signal at frequency $f_2$. The up-converted signal at frequency $f_2$ can then be transmitted to filter 72 for filtering certain frequency components of the signal. The filtered signal can then be amplified using amplifier 74. The amplified signal can then be transmitted to the second frequency up-converter device 71. The second frequency up-converter device 71 is configured to up-convert the signal with frequency $f_2$ into a signal with frequency $f_3$. The up-converted signal with frequency $f_3$ can then be transmitted to filter 73 for further filtering certain frequency components of the signal. The filtered signal can then be amplified using amplifier 75. The amplified signal can then be routed through the pair of amplifiers 77A and 77B configured in a combining scheme using combiners 76A and 76B to further amplify the signal (e.g., approximately double the power of the signal). The amplified signal can then be sent to antenna 16, 26 via circulator 78 and the filter 79 to be transmitted using antenna 16, 26.

The receive circuit 67 may include a first frequency down-converter device 80 and a second frequency down-converter 81. The receive circuit 67 may also include low noise amplifier 82, limiter 83, filter (e.g., bandpass filter—BPF) 84 and amplifier 85. The first frequency down-converter device 80 is connected to low noise amplifier 82 which is connected to circulator 78 via limiter 83. The second frequency down-converter device 81 is connected to amplifier 85 which is in turn connected to filter 84. The filter 84 is also connected to the first frequency down-converter 80.

A signal received from the antenna 16, 26 having a frequency $f_3$ is filtered using filter (e.g., lowpass filter—LPF) 79. The circulator routes the signal to limiter 83 in the receive circuit 67. The limiter 83 is a circuit that allows signals below a set value to pass unaffected and clips off the peaks of stronger signals that exceed the set value. The limiter 83 can reduce signal amplitude fluctuations. The signal output by limiter 83 is amplified by low noise amplifier LNA 82. The amplified signal is frequency down-converted from frequency $f_3$ into a signal at frequency $f_2$ by the first frequency down-converter 80. The signal at frequency $f_2$ can further be frequency filtered using filter 84. The frequency filtered signal at frequency $f_2$ is amplified using amplifier 85 and sent to the second frequency down-converter device 81 where the signal is further down-converted from frequency $f_2$ to frequency $f_1$. The signal at frequency $f_1$ is then transferred to transmit-receive switch 69 and output through port 60 and forwarded to transceiver 12, 22 for further processing.

The detector circuit 68 may include radio-frequency (RF) detectors 88A and 88B, controller 90 and bias control device 91. The RF detector 88A is connected to splitter 64. The controller 90 communicates with the RF detector 88A, with RF detector 88B, with transmit-receive switch 69, and with other devices, such as, display keypad 92, fixed locked oscillator (LO) 93, and synthesizer 94.

The frequency translation device 14, 24 may further include a frequency reference circuit 100. The frequency reference circuit 100 may include the fixed locked oscillator (LO) 93 and the synthesizer (e.g., phase locked synthesizer) 94. The frequency reference circuit 100 can also include GPS receiver module 95, phase locked reference oscillator 96. The GPS receiver module 95 is connected to phase locked reference oscillator 96 which is, in turn, connected to both the fixed LO 93 and the synthesizer 94. The GPS receiver module 95 is connected to GPS antenna 97 and is adapted to receive a GPS signal through the GPS antenna 97. The fixed LO 93 is connected to splitter 98 and the synthesizer 94 is connected to splitter 99. The splitter 98 is configured to split a signal from the fixed LO 93 between the frequency up-converter device 70 and the frequency down-converter device 81. The splitter 99 is configured to split a signal from the phase locked synthesizer 94 between the frequency up-converter device 71 and the frequency down-converter device 80.

In operation, the GPS receiver module 95 receives a GPS signal and provides a GPS frequency reference (for example, 10 MHz) to the phase locked reference oscillator 96. The fixed LO 93 receives a phase locked signal from the phase locked reference oscillator 96 and provides a signal with a certain fixed phase (i.e., phase locked) to both the frequency up-converter 70 and the frequency down-converter 81. The frequency up-converter 70 and the frequency down-converter 81 can use the frequency and phase information provided by the fixed LO 93 to up-convert or down-convert a signal from one frequency to another frequency. Similarly, the phase locked synthesizer 94 receives a phase locked signal from the phase locked reference oscillator 96 and provides a signal with a certain phase (i.e., phase locked) to both the frequency up-converter 71 and the frequency down-converter 80. The frequency up-converter 71 and the frequency down-converter 80 can use the frequency and phase information provided by the phase locked synthesizer to up-convert or down-convert a signal from one frequency to another frequency. While the fixed LO 93 provides a single phase locked frequency, the phase locked synthesizer 94 can expand the frequency operating range of the frequency translation device 14, 24 to support operation over multiple radio networks.

The RF detector circuit 88A is used to determine whether the frequency translation device 14, 24 is receiving an incoming signal via port 60. When the RF detector circuit 88A detects the incoming signal, the RF detector circuit 88A can send a signal to controller 90 to indicate that the RF detector circuit 88A has detected a signal. The controller 90 enables a transmit operation when the RF detector circuit 88A senses a signal is received. When the RF detector circuit 88A does not detect an incoming signal, the RF detector circuit 88A can send a signal to controller 90 indicating that the RF detector circuit 88A did not sense a signal. Alternatively, the RF detector 88A may not send a signal to controller 90 indicating that the RF detector circuit 88A did not sense a signal. The controller 90 enables a receive operation when the RF detector circuit 88A does not sense a signal is received.

In operation, when the RF detector 88A detects that a signal is output by splitter 64, the RF detector 88A sends a signal to controller 90 which in turn causes the transmit-receive switch 69 to route the incoming signal to the transmit circuit 66 and thus puts the frequency translation device 14, 24 in a transmit configuration. In the transmit configuration, the signal is frequency up-converted in the transmit circuit 66, as described in the above paragraphs. In addition, the controller 90 also sends a signal to bias control device 91 to set a bias voltage to amplifiers 77A and 77B. The two amplifiers 77A and 77B work in a combination scheme using combiners 76A and 76B to further amplify the frequency up-converted signal. The detector 88B is connected to a port of combiner 76B and receives a portion of the amplified frequency up-converted signal and provides a feedback to controller 90 to monitor the transmit power level of the amplified frequency up-converted signal. When the RF detector 88A does not detect a signal, the RF detector 88A either sends a signal to controller 90 or produces no signal. Based on the signal or the absence of signal received from the RF detector 88A, the controller 90 in turn reverts the transmit-receive switch 69 to a receive configuration. In the receive configuration, when the antenna 16, 26, receives a signal, the signal is input through port 61 and frequency filtered using filter 79. The frequency filtered signal is routed using circulator 78 to the receive circuit 67 where the signal is frequency down-converted as described in the above paragraphs.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. Thus, the present invention should not be limited by any of the above-described exemplary embodiments.

Moreover, the apparatus and devices of the present invention, like related apparatuses and devices used in electronics arts are complex in nature, are often best practiced by empirically determining the appropriate values of the operating parameters, or by conducting computer simulations to arrive at best design for a given application. Accordingly, all suitable modifications, combinations and equivalents should be considered as falling within the spirit and scope of the invention.

In addition, it should be understood that the figures, are presented for example purposes only. The architecture of the present invention is sufficiently flexible and configurable, such that it may be utilized in ways other than that shown in the accompanying figures.

What is claimed is:

1. A frequency translation device, comprising:
    a transmit circuit including a first frequency converter configured to wirelessly receive a signal at a first RF frequency from a wireless communication device that is separate from the frequency translation device and to convert the signal at the first RF frequency into a signal at one of a plurality of second RF frequencies;
    a receive circuit including a second frequency converter configured to convert a signal at the one of the plurality of second RF frequencies into a signal at the first RF frequency and to wirelessly send the converted signal at the first RF frequency to the wireless communication device that is separate from the frequency translation device;
    a detector circuit configured to determine when the frequency translation device is receiving a signal, and to route the signal to the transmit circuit or to the receive circuit; and
    a frequency reference circuit including a phase locked synthesizer configured to provide a selectable reference signal to the transmit circuit and receive circuit, wherein the selectable reference signal determines which one of the plurality of second RF frequencies is used by the transmit circuit and the receive circuit.

2. The device of claim 1, wherein the transmit circuit includes a first frequency up-converter device configured to convert the signal at the first RF frequency into the signal at the one of the plurality of second RF frequencies, wherein the first RF frequency is smaller than the one of the plurality of second RF frequencies.

3. The device of claim 2, wherein the transmit circuit includes a filter coupled to the first frequency up-converter device, the filter being configured to filter frequency components of the signal at the one of the plurality of second RF frequencies to obtain a filtered signal.

4. The device of claim 3, wherein the transmit circuit includes an amplifier coupled to the filter, the amplifier being configured to amplify the filtered signal.

5. The device of claim 2, wherein the transmit circuit includes a second frequency up-converter device configured to convert the signal at the one of the plurality of second RF frequencies into a signal at one of a plurality of third RF frequencies, wherein the one of the plurality of second RF frequencies is smaller than the one of the plurality of third RF frequencies, and wherein the selectable reference signal determines which one of the plurality of third RF frequencies is used by the transmit circuit.

6. The device of claim 5, wherein the second frequency up-converter device is in communication with the first frequency up-converter device.

7. The device of claim 1, wherein the receive circuit includes a first frequency down-converter device configured to convert the signal at the one of the plurality of second RF frequencies into the signal at the first RF frequency, wherein the first RF frequency is smaller than the one of the plurality of second RF frequencies.

8. The device of claim 7, wherein the receive circuit includes a low noise amplifier electrically coupled to the frequency down converter.

9. The device of claim 8, wherein the receive circuit includes a second frequency down-converter device configured to convert a signal at one of a plurality of third RF frequencies into the signal at the one of the plurality of second RF frequencies, wherein the one of the plurality of second RF frequencies is smaller than the one of the plurality of third RF frequencies, and wherein the selectable reference signal determines which one of the plurality of third RF frequencies is used by the receive circuit.

10. The device of claim 1, further comprising an antenna and a first relay adapted to connect the antenna to the transmit circuit or the receive circuit.

11. The device of claim 1, further comprising a splitter, and a second relay adapted to connect the splitter to the transmit circuit or the receive circuit, wherein the splitter is configured to split a signal between the detector circuit and the transmit circuit.

12. The device of claim 11, further comprising a port, and an attenuator electrically coupled to the splitter, the attenuator being electrically connected to the port.

13. The device of claim 11, wherein the detector circuit includes a radio-frequency detector, a comparator electrically connected to the radio-frequency detector, and a first and second relay drivers electrically connected to the comparator and in communication with the first relay and the second relay, respectively.

14. The device of claim 13, wherein the first relay driver is configured to cause the first relay to connect the splitter to the transmit circuit, wherein the second relay driver is configured to cause the second relay to connect the antenna to the transmit circuit, when the radio-frequency detector detects a signal.

15. The device of claim 13, wherein the first relay driver is configured to cause the first relay to connect the splitter to the receive circuit, wherein the second relay driver is configured to cause the second relay to connect the antenna to the receive circuit, when the radio-frequency detector does not detect a signal.

16. The device of claim 11, wherein the detector circuit includes a detector in communication with the splitter and a controller in communication with the detector and with the second relay, wherein the controller is configured to cause the second relay to connect the splitter to the transmit circuit, when the detector detects a signal.

17. The device of claim 1, wherein the frequency reference circuit further comprises a frequency reference in communication with the synthesizer and a splitter in communication with the phase locked synthesizer, the splitter being further connected to the transmit circuit and the receive circuit.

18. The device of claim 17, wherein the frequency reference circuit further comprises a phase locked oscillator in communication with the frequency reference and a second splitter in communication with the phase locked oscillator, the second splitter being further connected to the transmit circuit and the receive circuit.

19. The device of claim 17, wherein the frequency reference and the phase locked synthesizer cooperate to generate the one of the plurality of second RF frequencies.

20. The device of claim 18, wherein the frequency reference and the phase locked oscillator cooperate to generate the one of the plurality of second RF frequencies.

21. The device of claim 18, further comprising a GPS antenna, and a GPS receiver module in communication with the phase locked reference oscillator and the GPS antenna, the GPS receiver module being configured to receive a GPS signal through the GPS antenna.

22. A wireless transmission system, comprising:
a wireless communication device configured to wirelessly transmit a signal at a first RF frequency, wirelessly receive a signal at the first RF frequency, or both;
a frequency translation device separate from the wireless communication device and coupled to the wireless communication device, the frequency translation device being configured to convert the signal transmitted by the wireless communication device at the first RF frequency into a signal at one of a plurality of second RF frequencies and to convert a signal at the one of the plurality of second RF frequencies into a signal at the first RF frequency and transmit the converted signal at the first RF frequency to the wireless communication device; and
a frequency reference circuit including a phase locked synthesizer configured to provide a selectable reference signal to the frequency translation device, wherein the selectable reference signal determines which one of the plurality of second RF frequencies is used by the frequency translation device.

23. A wireless transmission system, comprising:
a plurality of wireless communication devices configured to wirelessly transmit signals at a first or third RF frequency, wirelessly receive signals at a first or third RF frequency, or both wirelessly transmit signals at a first or third RF frequency and wirelessly receive signals at a first or third RF frequency;
a plurality of frequency translation devices, each of the plurality of frequency translation devices being separate from each of the plurality of wireless communication devices and coupled to one of the plurality of wireless communication devices, the plurality of frequency translation devices being configured to convert signals transmitted by the wireless communication device to which the frequency translation device is coupled at the first or third RF frequency into signals at one of a plurality of second RF frequencies and to convert signals at the one of the plurality of second RF frequencies into signals at the first or third RF frequency and transmit the converted signals at the first or third RF frequency to the wireless communication device to which the frequency translation device is coupled; and
a frequency reference circuit including a phase locked synthesizer configured to provide a selectable reference signal to the plurality of frequency translation devices, wherein the selectable reference signal determines which one of the plurality of second RF frequencies is used by the plurality of frequency translation devices.

24. The system of claim 23, wherein the first RF frequency and the third RF frequency are substantially the same.

* * * * *